United States Patent
Sohn (10) Patent No.: US 7,286,360 B2
(45) Date of Patent: Oct. 23, 2007

(54) HEAT RADIATING SYSTEM AND METHOD FOR A MOBILE COMMUNICATION TERMINAL

(75) Inventor: Young-Jin Sohn, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 268 days.

(21) Appl. No.: 10/993,304

(22) Filed: Nov. 19, 2004

(65) Prior Publication Data

US 2005/0111194 A1    May 26, 2005

(30) Foreign Application Priority Data

Nov. 21, 2003  (KR) .................. 10-2003-0083149

(51) Int. Cl.
*H05K 7/20* (2006.01)
(52) U.S. Cl. .................. 361/704; 174/35 R; 361/715; 361/719; 361/813; 361/814
(58) Field of Classification Search .............. None
See application file for complete search history.

(56) References Cited

U.S. PATENT DOCUMENTS

| | | | | |
|---|---|---|---|---|
| 5,931,222 | A * | 8/1999 | Toy et al. .......... | 165/80.3 |
| 6,025,991 | A * | 2/2000 | Saito .................. | 361/704 |
| 6,195,267 | B1 * | 2/2001 | MacDonald et al. ...... | 361/800 |
| 2002/0064024 | A1 | 5/2002 | McCullough et al. | |
| 2002/0195228 | A1 * | 12/2002 | Corti et al. .......... | 165/80.3 |
| 2003/0057547 | A1 | 3/2003 | McCollough et al. | |
| 2003/0193794 | A1 * | 10/2003 | Reis et al. .......... | 361/816 |

FOREIGN PATENT DOCUMENTS

| | | |
|---|---|---|
| JP | 04-094562 | 3/1992 |
| JP | 10-229287 | 8/1998 |
| JP | 2002076217 | 3/2002 |
| JP | 2002-305271 | 10/2002 |
| JP | 2002-359489 | 12/2002 |
| JP | 2003-124663 | 4/2003 |
| JP | 2003-192913 | 7/2003 |
| JP | 2003-198173 | 7/2003 |
| JP | 2003-318585 | 7/2003 |
| RU | 2152697 | 7/2000 |
| WO | WO 01/65901 A2 | 9/2001 |
| WO | WO 0195687 | 12/2001 |

\* cited by examiner

*Primary Examiner*—Gregory D Thompson
(74) *Attorney, Agent, or Firm*—Lee, Hong, Degerman, Kang & Schmadeka (57) ABSTRACT

A system and method for transferring heat from a terminal in a mobile communication system. The system comprises a circuit board mounted to a terminal body, in which a heat generating component is mounted, and a shield frame for shielding electromagnetic waves generated from the circuit board and supporting the circuit board. At least one heat radiating apparatus is installed between the heat generating component and the shield frame. The at least one heat radiating apparatus transfers heat generated by the heat generating component away from the circuit board and substantially directly to the shield frame. The heat transfer prevents an impact of the generated heat being transferred to the circuit board from the shield frame.

9 Claims, 5 Drawing Sheets

HEAT RADIATING SYSTEM AND METHOD FOR A MOBILE COMMUNICATION TERMINAL

CROSS-REFERENCE TO RELATED APPLICATIONS

Pursuant to 35 U.S.C. § 119(a), this application claims the benefit of earlier filing date and right of priority to Korean Application No. 10-2003-0083149, filed on Nov. 21, 2003, the contents of which are hereby incorporated by reference herein in their entirety.

BACKGROUND OF THE INVENTION

1. Field of the Invention

The present invention relates to a heat radiating system and method of a terminal for a mobile communication system. In particular, a terminal having a system capable of improving the effective heat radiation of a component to the shield frame.

2. Description of the Related Art

A terminal of a mobile communication system has increased performance due to the inclusion of high performance components such as electrical components for performing image processing. The high performance electronic components produce more heat. In a mobile terminal such as a cell phone, the electronic components are densely packed to fit within a small footprint of the mobile phone. Due to the dense packing of these electrical components, heat radiates from the mobile terminal. When the mobile terminal (such as a cell phone) contacts a user's hand or face, the heat radiated transfers to a user resulting in discomfort when making a telephone call.

Therefore, there is a need for a system for effectively radiating the heat generated to prevent problems associated with high temperature, densely packed circuit electrical components of a terminal for a mobile communication system.

SUMMARY OF THE INVENTION

Features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

The invention is directed to provide a system and method for reducing heat generated by a terminal in a mobile communication. A circuit board is mounted in a terminal body. A heat radiating apparatus, such as a thermal paste, is installed between a heat generating component, such as an electrical circuit, and a shield frame. The heat radiating apparatus transfers substantially directly the heat generated to the shield frame, shields electromagnetic energy generated from the circuit board, and provides support for the circuit board.

In one embodiment, a terminal comprises a circuit board mounted to a terminal body, in which a heat generating component is mounted and a shield frame for shielding electromagnetic waves generated from the circuit board and supporting the circuit board. At least one heat radiating apparatus installed between the heat generating component and the shield frame, wherein the heat radiating apparatus transfers heat generated by the heat generating component away from the circuit board and substantially directly to the shield frame.

In one embodiment, the shield frame has a surface onto which an electromagnetic wave shield film and a heat conductive material are applied. The heat radiating apparatus is thermal paste adhered between the heat generating component and the shield frame.

The thermal paste is a viscous material for transferring heat generated from the heat generating component to the shield frame and prevents heat transfer to the circuit board from the shield frame. In one alternative of this embodiment, the thermal paste is formed from a viscous aluminum paste.

In yet another embodiment, the heat radiating apparatus comprises a heat radiating plate attached to a surface of the shield frame for providing self-heating radiation and diffusing the heat generated to the shield frame and a thermal plate. The thermal plate is held between the surface of the heat radiating plate and a surface of the heat generating component for transferring heat generated from the heat generating component to the heat radiating plate.

The heat radiating apparatus comprises a first heat radiating plate attached to a surface of the heat generating component mounted on the circuit board and a second heat radiating plate attached to a surface of the shield frame. A thermal paste is adhered between the first heat radiating plate and the second heat radiating plate for forming a heat transfer path to transfer heat away from the circuit board.

In yet another embodiment, a method is provided for reducing heating of a terminal comprises mounting a circuit board to a terminal body in which a heat generating component is mounted and providing a shield frame for shielding electromagnetic waves generated from the circuit board and supporting the circuit board.

The method further comprises installing at least one heat radiating apparatus between the heat generating component mounted on the circuit board and the shield frame for forming a heat transfer path, and transferring heat generated by the heat generating component from the least one heat radiating apparatus substantially directly to the shield frame to prevent heat being transferred to the circuit board from the shield frame.

Additional features and advantages of the invention will be set forth in the description which follows, and in part will be apparent from the description, or may be learned by practice of the invention. It is to be understood that both the foregoing general description and the following detailed description of the present invention are exemplary and explanatory and are intended to provide further explanation of the invention as claimed.

These and other embodiments will also become readily apparent to those skilled in the art from the following detailed description of the embodiments having reference to the attached figures, the invention not being limited to any particular embodiments disclosed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

Features, elements, and aspects of the invention that are referenced by the same numerals in different figures represent the same, equivalent, or similar features, elements, or aspects in accordance with one or more embodiments.

DETAILED DESCRIPTION OF THE PREFERRED EMBODIMENTS

The present invention relates to a system and method for reducing heat generated by a terminal in a mobile communication system. The invention provides a heat radiating apparatus installed between the heat generating component and a shield frame for preventing electromagnetic energy generated by the electrical components reaching the main printed circuit board.

Although the invention is illustrated with respect to a mobile terminal using shield frame, it is contemplated that the invention may be utilized in other devices for reducing heat from electronic components when transmitting, receiving, or processing signals from one location to another location, for example.

The present invention provides a portable terminal having a heat radiating apparatus capable of effectively radiating heat generated from a heat generating component mounted on a circuit board, die, electronic package, or the like. The heat radiating apparatus forms a heat transfer path for transferring heat generated from the heat generating component. The heat transfer occurs directly (or at least substantially directly) to a shield frame between the heat generating component and the shield frame.

The present invention provides a portable terminal having a heat radiating apparatus capable of securing a heat transfer path by a heat generating component directly contacting (or at least substantially directly contacting) a shield frame and simultaneously preventing heat transferred to a circuit board through the shield frame.

Figure 1:
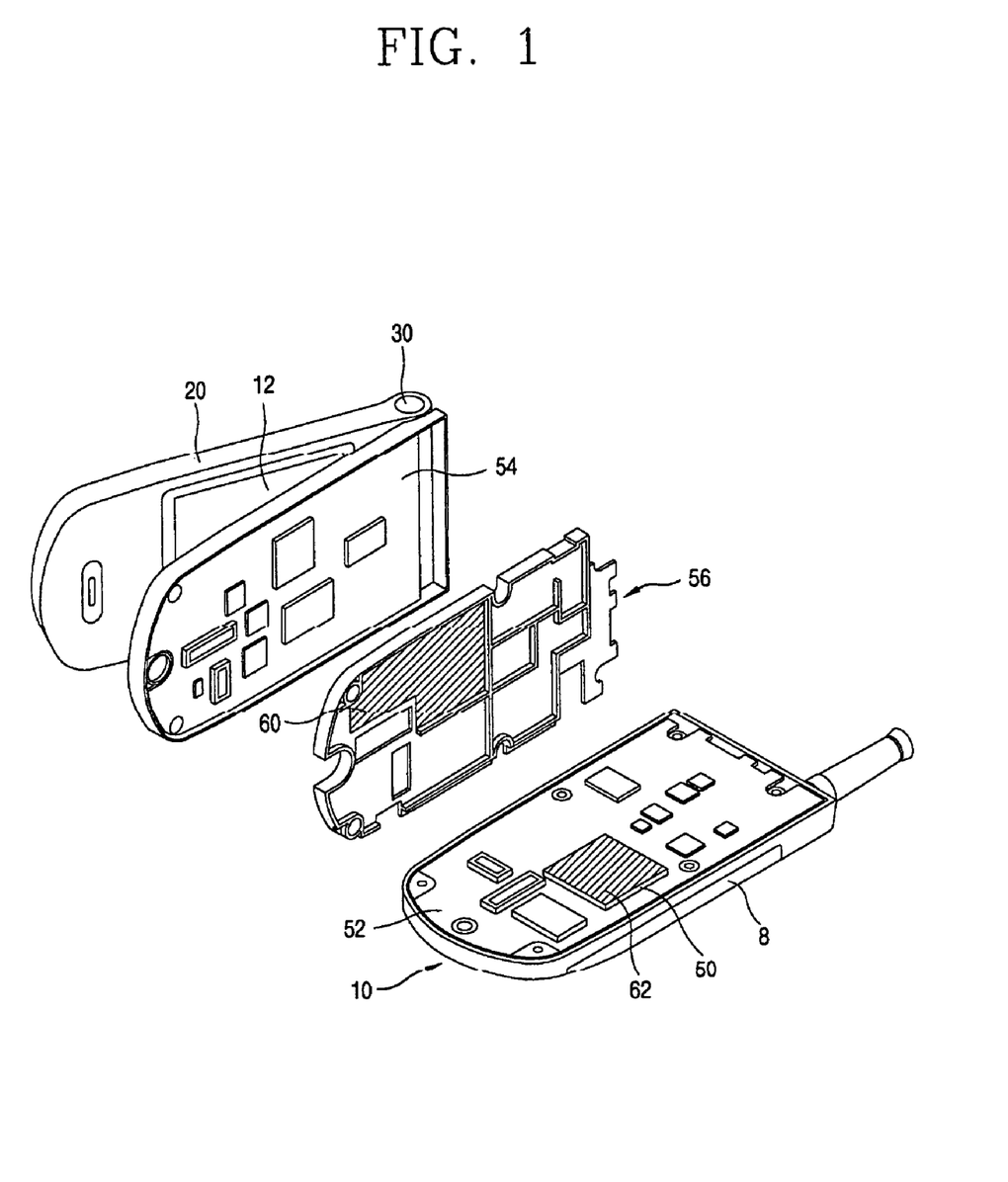
FIG. 1 is a disassembled perspective view of a portable terminal in accordance with a first embodiment of the present invention.

Referring to FIG. 1, a terminal body, for example, a terminal main body 10 provides menu buttons and dial buttons or the like, and a battery 8 providing terminal power mounted to the terminal main body 10. A folder 20 rotatably connects to the terminal main body 10. The folder 20 attaches to a liquid crystal display (LCD) 12. The LCD displays desired information. A hinge connection portion 30 formed between the main body 10 and the folder 20 rotatably connects the folder 20 to the main body 10.

Figure 2:
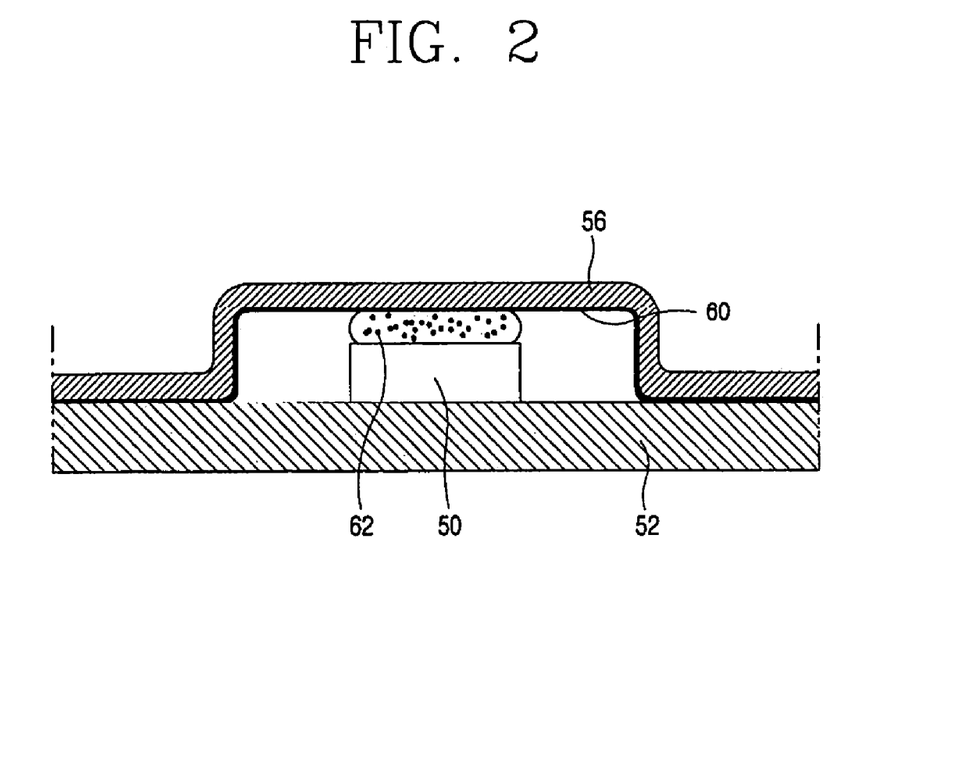
FIG. 2 is a sectional view showing a heat radiating apparatus of a portable terminal in accordance with a first embodiment of the present invention.

Referring to FIG. 2, a terminal main body 10 comprises a circuit board, which is in this example a main printed circuit board (PCB) 52. The main PCB 52 is utilized to mount heat generating component 50 and various circuit components. Menu buttons and the dial buttons mount on a keypad PCB 54. A shield frame 56 is provided between the main PCB 52 and the keypad PCB 54. The shield frame 56 supports the main PCB 52 and the keypad PCD 54. The shield frame 56 shields electromagnetic waves generated from the circuit components mounted on the main PCB 52 from being radiated outside the terminal, such as to a user. A heat radiating apparatus installed between the shield frame 56 and the main PCB 52 form a heat-transfer path. The heat-transfer path transfers generated heat from heat generating component 50 to the shield frame 56.

The shield frame 56 is formed from a plastic material and coupled to the terminal main body 10 to produce a reduced cost and weight terminal. An electromagnetic wave shielding film is applied to shield electromagnetic waves and a heat-conductive material 60 for radiating heat applied onto the surface of the shield frame 56.

Referring to FIG. 2, the heat radiating apparatus comprises at least one thermal paste 62 adhering between the heat generating component 50 and the shield frame 56 mounted on the main PCB 52. The at least one thermal paste 62 substantially directly transfers the heat generated from the heat generating component 50 to the shield frame 56.

The thermal paste 62 is preferably made of a viscous aluminum powder. The thermal paste 62 connects the heat generating component 50 and the shield frame 56 to substantially directly transfer the heat generated from the heat generating component to the surface of the shield frame 56. The heat generated is diffused through the heat-conductive material 60 applied onto the surface of the shield frame 56. The thermal paste 62 prevents heat transfer to the main PCB 52 through the shield frame 56.

Figure 3:
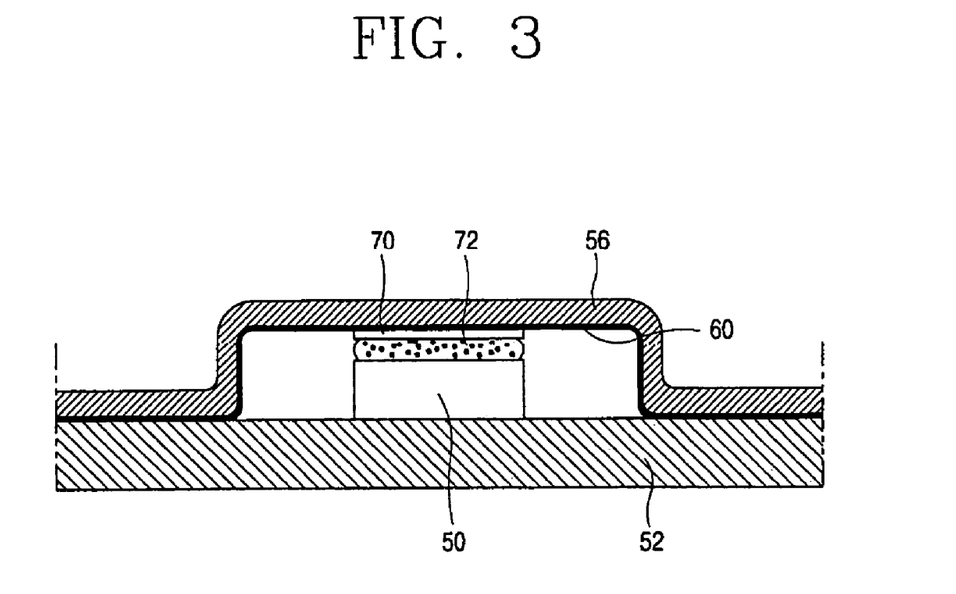
FIG. 3 is a sectional view illustrating a heat radiating apparatus of a portable terminal in accordance with a second embodiment of the present invention.

Referring to FIG. 3, the heat radiating apparatus comprises a heat radiating plate 70 is attached to the surface of the shield frame 56 to provide a self-heating radiation operation, and diffuse heat to the shield frame 56. The heat radiating plate 70, for example, is preferably a copper plate, but may be substituted with alternative similar elemental property and conductive materials. In the alternative, the heat radiating plate 70 is a stacked arrangement of copper film tapes attached to the surface of the shield frame 56, which the stacked arrangement is disposed for facing the heat generating component 50. The thermal paste 72 attaches between a surface of the heat radiating plate 70 and a surface of the heat generating component 50. The thermal paste 72, for example, is formed of a viscous aluminum powder having a thermal absorbing impact the same as the thermal paste 62 described above.

Heat radiation generated from the heat generating component 50 transfers to the thermal paste 72. The thermal paste 72 transfers heat to the heat radiating plate 70. The heat radiating plate 70 performs a self-heating radiation operation and transfers heat to a surface of the shield frame 56. The thermal paste 72 comprising a viscous material preventing heat transfer to the main PCB 62 from the shield frame 56.

Figure 4:
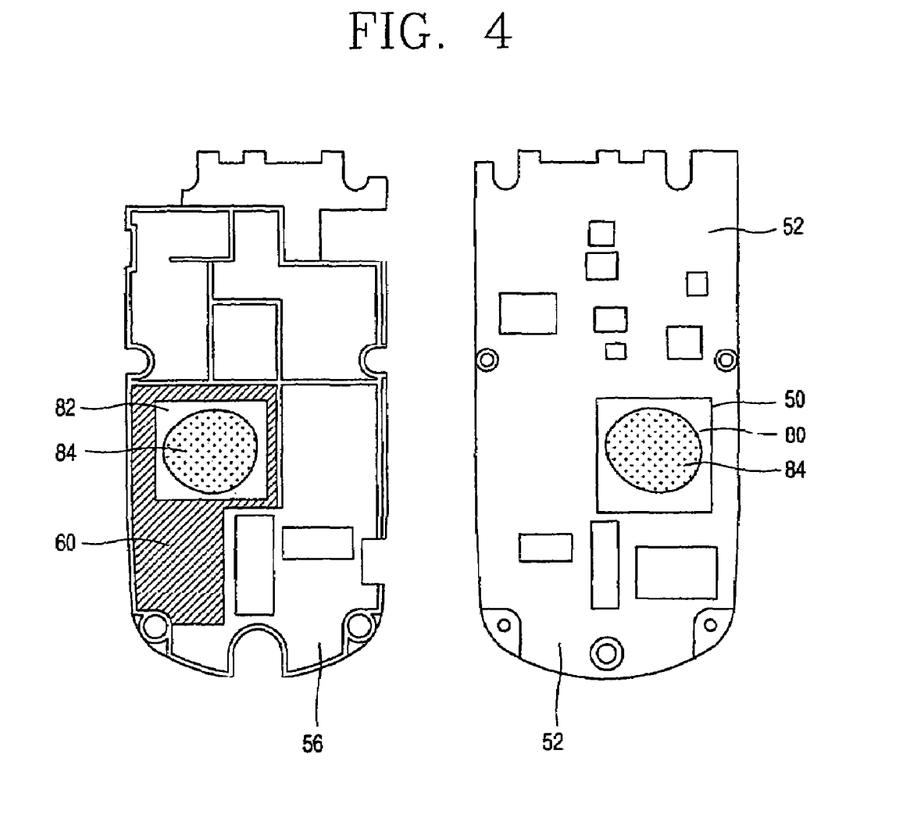
FIG. 4 is a front view of a main PCB and a shield frame of a portable terminal in accordance with a third embodiment of the present invention.

Referring to FIG. 4, the heat radiating apparatus comprises a first heat radiating plate 80 attached to a surface of a heat generating component 50 mounted on a main PCB 52. A second heat radiating plate 82 attaches to a surface of the shield frame 56. A thermal paste 84 adheres between the first heat radiating plate 80 and the second heat radiating plate 82. The first heat radiating plate 80 and the second heat radiating plate 82 are formed, in this example, by a copper plate, a stack of several copper film tapes, or the like. The thermal paste 84 is made of a viscous aluminum powder.

In an exemplary embodiment, the first heat radiating plate 80 radiates heat generated from the heat generating component 50. The second heat radiating plate 82 radiates heat previously radiated by the first heat radiating plate 80. The second heat radiating plate 82 diffuses the heat generated to the shield frame 56 and the thermal paste 84.

Figure 5:
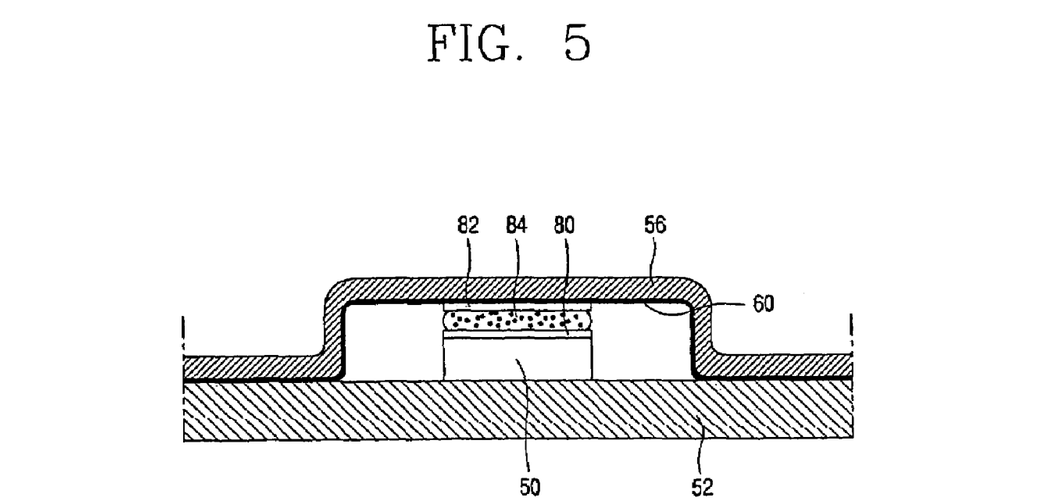
FIG. 5 is a sectional view illustrating a heat radiating apparatus of a portable terminal in accordance with a third embodiment of the present invention.

Referring to FIG. 5, heat is generated (from first heat radiating plate) from the heat radiating component 50 mounted on the main PCB 52 transfers through the first heat radiating plate 80. The first heat radiating plate 80 attaches to the surface of the heat generating component 50. The heat passing through the first heat radiating plate 80 is transferred to the second heat radiating plate 82 through the thermal paste 84. The transferred heat passes through second heat radiating plate 82 being diffused to the shield frame 56. The thermal paste 84 which is formed of a viscous material prevents heat transferring to the main PCB from the shield frame 84.

The heat radiating apparatus of the invention maximizes a heat radiating effect because the thermal paste 62 adheres directly (or at least substantially directly) between heat generating component 50 mounted on a main PCB 52. A shield frame 56 directly (or at least substantially directly) transfers heat generated by the heat generating component 50 to the shield frame 56 through the thermal paste 84 which diffuses the generated heat.

The thermal paste 62, for example, a viscous material which can absorb heat and prevent any impact from the heat generated impact being transferred from the shield frame 56 to a main PCB 52. In addition, effective heat radiation effect can be improved because heat is radiated through a heat radiating plate 60 and diffused into the shield frame 56. The heat radiating plate 60 attaches, in one example, to a surface of the shield frame 56. In an alternative embodiment, the heat radiating plate 60 attaches to the heat radiating plates 80, 82 to the shield frame 56 and heat generating component 50, respectively.

A method of the present invention for reducing heating of a terminal of a mobile communication system comprises providing a shield frame for shielding electromagnetic waves generated from the circuit board and supporting the circuit board. The method further comprises mounting a circuit board to a terminal body in which a heat generating component is mounted, installing at least one heat radiating apparatus between the heat generating component mounted on the circuit board and the shield frame, for forming a heat transfer path. The method further comprises transferring heat generated by the heat generating component from the least one heat radiating apparatus substantially directly to the shield frame to prevent heat being transferred to the circuit board from the shield frame.

The method for heat transfer further comprises applying a heat conductive material to a surface on an electromagnetic wave shield. In yet another embodiment of the method, comprising applying a thermal paste to the heat radiating apparatus between the heat generating component mounted on the circuit board and the shield frame for transferring heat generated from the heat generating component to the shield frame.

In accordance with another aspect of the invention, heat generated from the heat generating component is transferred to the shield frame through the thermal paste formed of a viscous material for preventing heat transfer to the circuit board from the shield frame. In one alternative embodiment, the thermal paste is made of viscous aluminum paste.

The method further comprises attaching a heat radiating plate to the surface of the shield frame for performing self-heating radiation and diffusing heat to the shield frame; and attaching a thermal paste between the surface of the heat radiating plate and the surface of the heat generating component for transferring heat generated from the heat generating component to the heat radiating plate. The heat radiating plate is formed by at least one copper film tape.

In yet another embodiment, the thermal paste is made of a viscous material, in which transfers heat generated from the heat generating component to the heat radiating plate and simultaneously prevents heat transfer from to the circuit board through the shield frame.

In yet another embodiment, the method further comprises attaching a first heat radiating plate to a surface of the heat generating component mounted on the circuit board, and attaching a second heat radiating plate to a surface of the shield frame. The method further comprises adhering a thermal plate between the first heat radiating plate and the second heat radiating plate for forming a heat transfer path.

The first heat radiating plate and the second heat radiating plate are formed from one copper film tape or stacking several copper film tapes. The thermal paste is made of a viscous material in which can prevent external impact from being transferred to the circuit board through the shield frame. The thermal paste comprises an aluminum powder.

The following are examples including a mobile communication device and a mobile communication network using the system and the method of the present invention.

Figure 6:
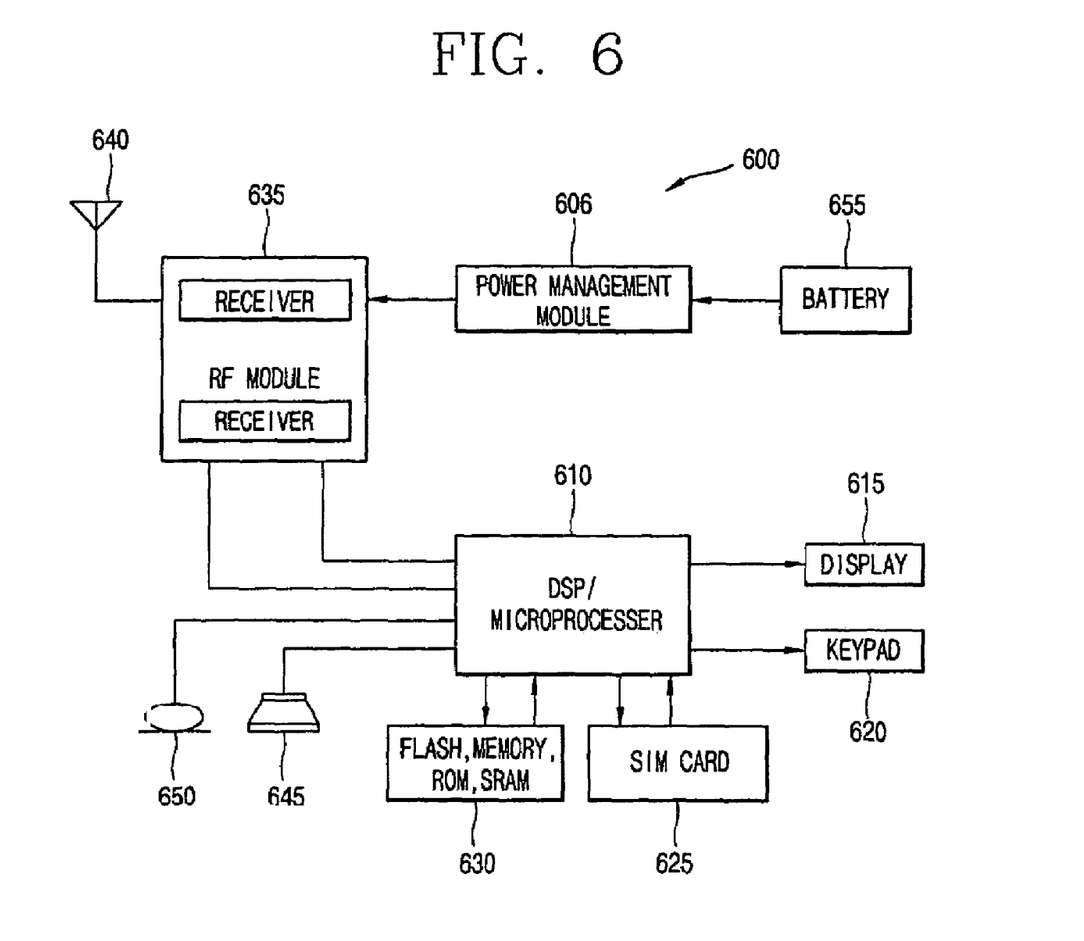
FIG. 6 is a block diagram illustrating a mobile communication device incorporating the systems and method of the present invention.

Referring to FIG. 6, the mobile communication device 600 comprises a processing unit 610 such as a microprocessor or digital signal processor, an RF module 635, a power management module 606, an antenna 640, a battery 655, a display 615, a keypad 620, a storage unit 630 such as flash memory, ROM or SRAM, a speaker 645 and a microphone 650.

A user enters instructional information, for example, by pushing the buttons of a keypad 620 or by voice activation using the microphone 650. The processing unit 610 receives and processes the instructional information to perform the appropriate function. Operational data may be retrieved from the storage unit 630 to perform the function. Furthermore, the processing unit 610 may display the instructional and operational information on the display 615 for the user's reference and convenience.

The processing unit 610 issues instructional information to the RF module 635, to initiate communication, for example, transmit radio signals comprising voice communication data. The RF module 635 comprises a receiver and a transmitter to receive and transmit radio signals. The antenna 640 facilitates the transmission and reception of radio signals. Upon receive radio signals, the RF module 635 may forward and convert the signals to baseband frequency for processing by the processing unit 610. The processed signals would be transformed into audible or readable information outputted via the speaker 645.

The processing unit 610 performs the systems and methods as illustrated in FIGS. 2-5. In the following example, the heat generating component 50 is the processing unit 610. As an example, the mobile communication device comprises a shield frame for shielding electromagnetic waves generated from a circuit board and supporting a circuit board; and at least one heat radiating apparatus installed between the processing unit 610 mounted on the circuit board. The shield frame forms a heat transfer path, in which heat generated by the processing unit transfers substantially to the shield frame. The heat generated is prevented from being transferred to the circuit board from the shield frame.

Other features, as described above in FIG. 2-5, may be incorporated as well in this embodiment.

The processing unit 610 stores the messages received from and messages transmitted to other users in the storage unit 630, receive a conditional request for message input by the user, process the conditional request to read data corresponding to the conditional request from the storage unit. The processing unit 610 outputs the message data to the display unit 615. The storage unit 630 is adapted to store message data of the messages both received and transmitted.

Figure 7:
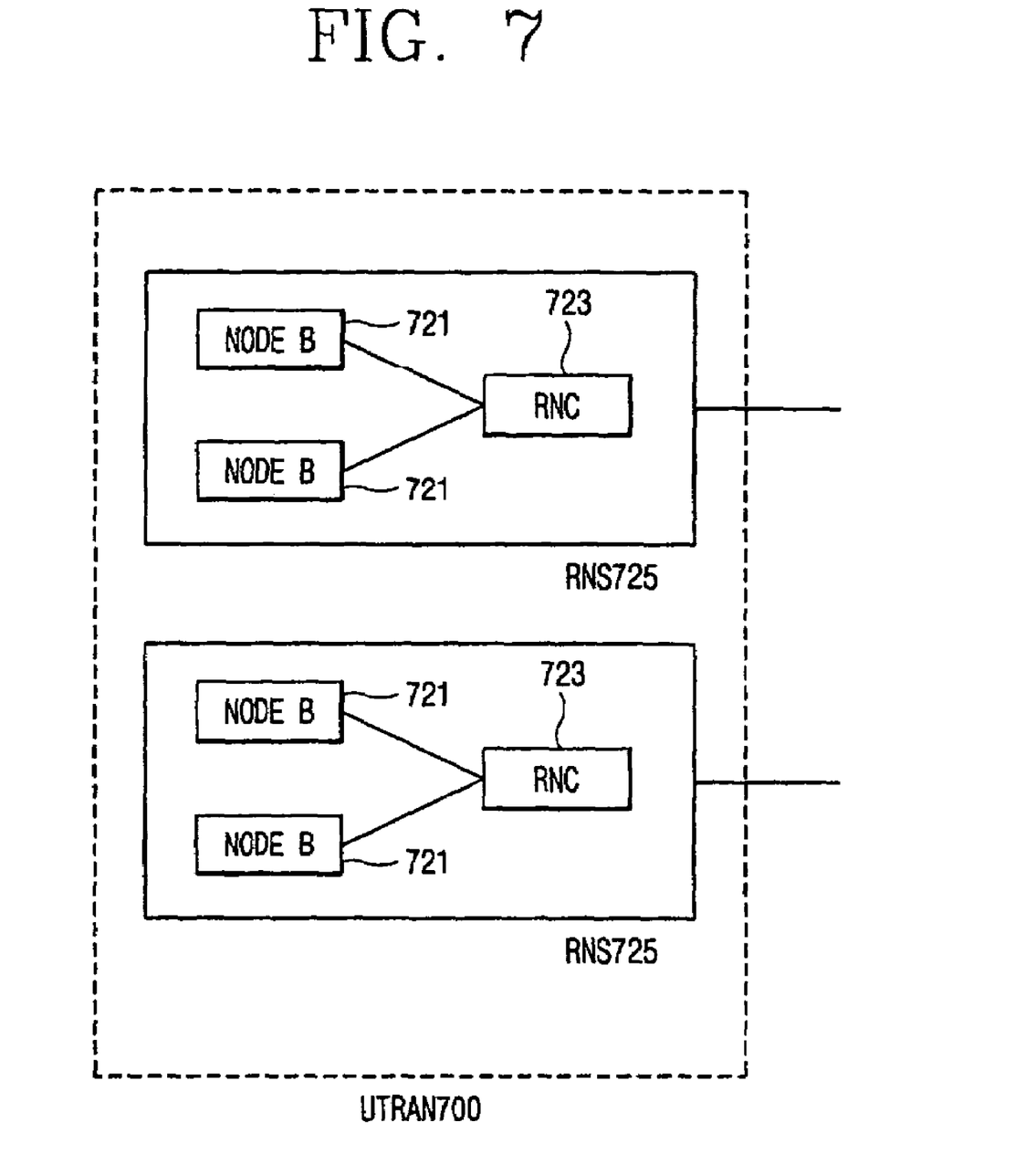
FIG. 7 is a block diagram illustrating a UTRAN incorporating the systems and the methods of the invention.

Referring to FIG. 7, the UTRAN 700 includes one or more radio network sub-systems (RNS) 725. Each RNS 725 includes a radio network controller (RNC) 723 and a plurality of Node-Bs (base stations) 721 managed by the RNC. The RNC 723 handles the assignment and management of radio resources and operates as an access point with respect to the core network. Furthermore, the RNC 723 is adapted to perform the methods of the present invention.

The Node-Bs 721 receive information sent by the physical layer of the terminal 710 through an uplink, and transmit data to the terminal through a downlink. The Node-Bs 721 operate as access points, or as a transmitter and receiver, of the UTRAN 700 for the terminal. It will be apparent to one skilled in the art that the mobile communication device 700 may be readily implemented using, for example, the processing unit 710 (of FIGS. 2-5) or other data or digital processing device, either alone or in combination with external support logic.

As an example, the controller 710 is a system for controlling flow of a communication signal. In the following example, the heat generating component 50 is the controller 710. As an example, the network comprises a shield frame for shielding electromagnetic waves generated from a circuit board and supporting a circuit board; and at least one heat radiating apparatus installed between the controller 710 mounted on the circuit board. The shield frame forms a heat transfer path, in which heat generated by the processing unit transfers substantially to the shield frame. The heat generated is prevented from being transferred to the circuit board from the shield frame. The controller 710 also performs the methods and the systems as illustrated in FIGS. 2-5.

It will be apparent to one skilled in the art that the preferred embodiments of the present invention can be readily implemented using, for example, the processing unit 610 (of FIG. 6) or other data or digital processing device, either alone or in combination with external support logic.

Although the present invention is described in the context of a consumer product such as a MP3 player, the present invention may also be used in any wired or wireless communication systems using mobile devices, such as PDAs and laptop computers equipped with wired and wireless wireless communication capabilities. Moreover, the use of certain terms to describe the present invention should not limit the scope of the present invention to certain type of wireless communication system, such as UMTS. The present invention is also applicable to other wireless communication systems using different air interfaces and/or physical layers, for example, TDMA, CDMA, FDMA, WCDMA, etc.

The preferred embodiments may be implemented as a method, system or article of manufacture using standard programming and/or engineering techniques to produce software, firmware, hardware, or any combination thereof. The term "article of manufacture" as used herein refers to code or logic implemented in hardware logic (e.g., an integrated circuit chip, Field Programmable Gate Array (FPGA), Application Specific Integrated Circuit (ASIC), etc.) or a computer readable medium (e.g., magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.).

Code in the computer readable medium is accessed and executed by a processor. The code in which preferred embodiments are implemented may further be accessible through a transmission media or from a file server over a network. In such cases, the article of manufacture in which the code is implemented may comprise a transmission media, such as a network transmission line, wireless transmission media, signals propagating through space, radio waves, infrared signals, etc. Of course, those skilled in the art will recognize that many modifications may be made to this configuration without departing from the scope of the present invention, and that the article of manufacture may comprise any information bearing medium known in the art.

The logic implementation shown in the figures described specific operations as occurring in a particular order. In alternative implementations, certain of the logic operations may be performed in a different order, modified or removed and still implement preferred embodiments of the present invention. Moreover, steps may be added to the above described logic and still conform to implementations of the invention.

The foregoing embodiments and advantages are merely exemplary and are not to be construed as limiting the present invention. The present teaching can be readily applied to other types of systems. The description of the present invention is intended to be illustrative, and not to limit the scope of the claims. Many alternatives, modifications, and variations will be apparent to those skilled in the art. Accordingly, the invention is not limited to the precise embodiments described in detail hereinabove.

With respect to the claims, it is applicant's intention that the claims not be interpreted in accordance with the sixth paragraph of 35 U.S.C. section 112 unless the term "means" is used followed by a functional statement. In the claims, means-plus-function clauses are intended to cover the structure described herein as performing the recited function and not only structural equivalents but also equivalent structures.

Further, with respect to the claims, it should be understood that any of the claims described below may be combined for the purposes of the present invention.

What is claimed is:

1. In a mobile communication system, a terminal producing reduced thermal heating to a user comprising:
    a circuit board mounted to a terminal body, in which a heat generating component is mounted;
    a shield frame for shielding electromagnetic waves generated from a circuit board and supporting a circuit board; and
    at least one heat radiating apparatus installed between the heat generating component and the shield frame, wherein the heat radiating apparatus transfers heat generated by the heat generating component away from the circuit board and substantially directly to the shield frame, wherein the heat radiating apparatus comprises:
    a first heat radiating plate attached to a surface of the heat generating component mounted on the circuit board;
    a second heat radiating plate attached to a surface of the shield frame; and
    a thermal paste adhered between the first heat radiating plate and the second heat radiating plate for forming a heat transfer path to transfer heat away from the circuit board.

2. The terminal of claim 1, wherein the first heat radiating plate and the second heat radiating plate are formed from at least one copper film tape.

3. The terminal of claim 1, wherein the first heat radiating plate and the second heat radiating plate are formed from a stack of copper film tape.

4. The terminal of claim 1, wherein the thermal paste is made of a viscous material which prevents heat being transferred to the circuit board through the shield frame.

5. The terminal of claim 3, wherein the thermal paste comprises an aluminum powder.

6. A method for reducing heating of a terminal for a mobile communication system comprising:

mounting a circuit board to a terminal body in which a heat generating component is mounted;

providing a shield frame for shielding electromagnetic waves generated from a circuit board and supporting a circuit board mounted in a terminal;

installing at least one heat radiating apparatus between the heat generating component and the shield frame for forming a heat transfer path, wherein the heat radiating apparatus comprises first and second heat radiating plates and a thermal paste;

transferring heat generated by the heat generating component from the at least one heat radiating apparatus substantially directly to the shield frame to prevent heat being transferred to the circuit board from the shield frame;

attaching the first heat radiating plate to a surface of the heat generating component mounted on the circuit board;

attaching the second heat radiating plate to a surface of the shield frame; and holding the thermal paste between the first heat radiating plate and the second heat radiating plate to form a heat transfer path for transferring heat from the circuit board.

7. The method of claim 6, wherein the first heat radiating plate and the second heat radiating plate are formed from at least one of a copper film tape or a stack formed from several copper film tapes.

8. The method of claim 6, wherein the thermal paste is made of a viscous material for preventing the heat generated being transferred to the circuit board through the shield frame.

9. The method of claim 6, wherein the thermal paste comprises an aluminum powder.

* * * * *